United States Patent
Li et al.

(10) Patent No.: US 12,119,072 B2
(45) Date of Patent: Oct. 15, 2024

(54) PROTECTION CIRCUIT, METHOD AND APPARATUS FOR DATA PATH, AND COMPUTER READABLE STORAGE MEDIUM

(71) Applicant: Horizon Journey (Hangzhou) Artificial Intelligence Technology Co., Ltd., Zhejiang (CN)

(72) Inventors: Jing Li, Zhejiang (CN); Yi Zhou, Zhejiang (CN); Luyang Zhang, Zhejiang (CN); Wenxing Li, Zhejiang (CN)

(73) Assignee: Horizon Journey (Hangzhou) Artificial Intelligence Technology Co., Ltd., Zhejiang (CN)

( * ) Notice: Subject to any disclaimer, the term of this patent is extended or adjusted under 35 U.S.C. 154(b) by 0 days.

(21) Appl. No.: 17/907,680

(22) PCT Filed: Feb. 11, 2022

(86) PCT No.: PCT/CN2022/076079
§ 371 (c)(1),
(2) Date: Sep. 29, 2022

(87) PCT Pub. No.: WO2022/206190
PCT Pub. Date: Oct. 6, 2022

(65) Prior Publication Data
US 2024/0212778 A1 Jun. 27, 2024

(30) Foreign Application Priority Data
Mar. 31, 2021 (CN) .......................... 202110353271.5

(51) Int. Cl.
*G11C 29/00* (2006.01)
*G11C 29/42* (2006.01)

(52) U.S. Cl.
CPC .................................. *G11C 29/42* (2013.01)

(58) Field of Classification Search
None
See application file for complete search history.

(56) References Cited

U.S. PATENT DOCUMENTS

| 5,410,546 A | 4/1995 | Boyer et al. |
| 5,912,752 A | 6/1999 | Mollett et al. |

(Continued)

FOREIGN PATENT DOCUMENTS

| CN | 102831037 A | 12/2012 |
| CN | 103164298 A | 6/2013 |

(Continued)

OTHER PUBLICATIONS

Extended European Search Report from the corresponding European Patent Application No. 22778375.0 mailed on Dec. 13, 2023.

(Continued)

*Primary Examiner* — Mujtaba M Chaudry
(74) *Attorney, Agent, or Firm* — K&L Gates LLP

(57) ABSTRACT

Disclosed are protection circuit, method and apparatus for data path and a computer readable storage medium. The circuit includes an input processing circuit, an output processing circuit, and a comparison module. The comparison module is electrically connected to the input processing circuit and the output processing circuit, respectively; the input processing circuit is configured to perform a check operation on an input data frame according to a preset check mode to obtain a first operation result; the output processing circuit is configured to perform a check operation on an output data frame corresponding to the input data frame according to the preset check mode to obtain a second operation result; and the comparison module is configured to acquire the first operation result and the second operation (Continued)

result, and generate a first error alarm signal for the data path based on the first operation result and the second operation result.

20 Claims, 5 Drawing Sheets

(56) References Cited

U.S. PATENT DOCUMENTS

| | | | | |
|---|---|---|---|---|
| 6,938,201 | B2* | 8/2005 | Goyins | H03M 13/091 |
| | | | | 714/824 |
| 8,321,778 | B2* | 11/2012 | Bains | G06F 11/1004 |
| | | | | 714/763 |
| 9,325,346 | B1 | 4/2016 | Zhu | |
| 9,697,073 | B1* | 7/2017 | Zhu | G06F 5/065 |
| 10,210,040 | B2* | 2/2019 | Circello | H03M 13/2927 |
| 2002/0191606 | A1* | 12/2002 | Wu | H04L 9/40 |
| | | | | 370/389 |
| 2004/0049726 | A1* | 3/2004 | Goyins | G06F 11/1008 |
| | | | | 714/E11.035 |
| 2004/0111660 | A1 | 6/2004 | Kim et al. | |
| 2007/0006025 | A1* | 1/2007 | Onozuka | H04L 1/0046 |
| | | | | 714/11 |
| 2010/0023846 | A1 | 1/2010 | Wu | |
| 2015/0281742 | A1 | 10/2015 | Staudenmaier et al. | |
| 2017/0010980 | A1 | 1/2017 | Bernasconi et al. | |
| 2018/0039538 | A1* | 2/2018 | Freikorn | G06F 11/1048 |
| 2019/0227867 | A1 | 7/2019 | Ellur | |
| 2021/0049068 | A1 | 2/2021 | Schaefer et al. | |

FOREIGN PATENT DOCUMENTS

| | | |
|---|---|---|
| CN | 103677919 A | 3/2014 |
| CN | 104618040 A | 5/2015 |
| CN | 107688505 A | 2/2018 |
| CN | 111654265 A | 9/2020 |
| CN | 112242177 A | 1/2021 |
| CN | 112948167 A | 6/2021 |
| JP | S61127241 A | 6/1986 |
| JP | 2004103005 A | 4/2004 |
| WO | 2021008248 A1 | 1/2021 |

OTHER PUBLICATIONS

Partial Supplementary European Search Report from the corresponding European Patent Application No. 22778375.0 mailed on Sep. 12, 2023.
First Office Action from the corresponding Japanese Patent Application No. 2022-557733, mailed on Nov. 14, 2023 (English Translation included).
International Search Report and Written Opinion for International PCT Application No. PCT/CN2022/076079, dated May 19, 2022.
Xiao-fei Shi et al., Design and Implementation of RPR MAC datapath, School of Information science and engineering, Shandong University, Jinan 250100, China (Oct. 2008), pp. 1-4.
Liu Cheng et al., A Resilient NoC Design through Data Path Salvaging, Key Laboratory of Computer System and Architecture, Institute of Computing Technology, Chinese Academy of Science, Beijing 100080 (Jul. 2010), pp. 1-8.

* cited by examiner

PROTECTION CIRCUIT, METHOD AND APPARATUS FOR DATA PATH, AND COMPUTER READABLE STORAGE MEDIUM

CROSS-REFERENCE TO RELATED APPLICATIONS

This application is a U.S. National Stage Entry under 35 U.S.C. § 371 of International Patent Application No. PCT/CN2022/076079, entitled PROTECTION CIRCUIT, METHOD AND APPARATUS FOR DATA PATH, AND COMPUTER READABLE STORAGE MEDIUM, filed Feb. 11, 2022, which claims priority to and the benefit of Chinese Patent Application No. 202110353271.5, entitled PROTECTION CIRCUIT, METHOD AND APPARATUS FOR DATA PATH, AND COMPUTER READABLE STORAGE MEDIUM, filed with the China National Intellectual Property Administration (CNIPA) on Mar. 31, 2021, the entire disclosures of which are incorporated by reference in their entirety herein.

TECHNICAL FIELD

The disclosure relates to a technical field of data processing, and particularly to a protection circuit, method and apparatus for a data path, and a computer readable storage medium.

BACKGROUND

With the development of technologies, the traditional data path (such as an image path) has been unable to meet requirements of system functional safety, and corresponding circuits need to be added to protect the image path. A protection solution used at present is: redundancy design of key modules, parity check protection for data path registers, and Error Checking and Correcting (ECC) protection for storage units are performed simultaneously in the image path, which will result in excessive hardware overhead of circuits.

SUMMARY

The disclosure is proposed to solve the above technical problems. Embodiments of the disclosure provide a protection circuit, method and apparatus for a data path, and a computer readable storage medium.

According to an aspect of the embodiments of the disclosure, a protection circuit for a data path is provided, including: an input processing circuit, an output processing circuit, and a comparison module;
 the comparison module is electrically connected to the input processing circuit and the output processing circuit, respectively;
 the input processing circuit is configured to perform a check operation on an input data frame according to a preset check mode to obtain a first operation result;
 the output processing circuit is configured to perform a check operation on an output data frame corresponding to the input data frame according to the preset check mode to obtain a second operation result; and
 the comparison module is configured to acquire the first operation result and the second operation result, and generate a first error alarm signal for the data path based on the first operation result and the second operation result.

According to another aspect of the embodiments of the disclosure, a protection method for a data path is provided, including:
 performing a check operation on an input data frame according to a preset check mode to obtain a first operation result;
 performing a check operation on an output data frame corresponding to the input data frame according to the preset check mode to obtain a second operation result; and
 generating a first error alarm signal for the data path based on the first operation result and the second operation result.

According to still another aspect of the embodiments of the disclosure, a protection apparatus for a data path is provided, including:
 a first processing module, configured to perform a check operation on an input data frame according to a preset check mode to obtain a first operation result;
 a second processing module, configured to perform a check operation on an output data frame corresponding to the input data frame according to the preset check mode to obtain a second operation result; and
 a first generation module, configured to generate a first error alarm signal for the data path based on the first operation result generated from the first processing module and the second operation result generated from the second processing module.

According to yet another aspect of the embodiments of the disclosure, a computer readable storage medium is provided, in which a computer program is stored and used for implementing the abovementioned protection method for the data path.

According to yet another aspect of the embodiments of the disclosure, an electronic device is provided, including:
 a processor; and
 a memory, configured to store a processor-executable instruction; where
 the processor is configured to read the executable instruction from the memory and execute the instruction to implement the abovementioned protection method for the data path.

According to the protection circuit for the data path, method, and apparatus, and the computer readable storage medium provided in the foregoing embodiments of the disclosure, the input processing circuit may perform the check operation on the input data frame to obtain the first operation result, the output processing circuit may perform the check operation on the output data frame corresponding to the input data frame to obtain the second operation result, and the comparison module may generate the first error alarm signal for the data path based on the first operation result and the second operation result. Therefore, it is possible to find out an error occurred in the data path in time, and notify the relevant personnel of the error in time, so as to realize protection for the data path. It can be seen that, in the embodiments of the disclosure, through providing the protection circuit with a simple hardware structure, outside the data path, including the input processing circuit, the output processing circuit, and the comparison module in conjunction with the check operation processing and use of the operation results, the first error alarm signal for the data path can be generated so as to effectively realize the protection for the data path, without separately protecting each part of the data path, inside the data path, and therefore, the protection for the data path can be realized with a low hardware overhead in the embodiments of the disclosure.

The technical solution of the disclosure will be further described in detail below through the accompanying drawings and the embodiments.

BRIEF DESCRIPTION OF DRAWINGS

By more detailed description of embodiments of the disclosure with reference to the accompanying drawings, the above and other objectives, features, and advantages of the disclosure will become more apparent. The accompanying drawings are used to provide further understanding of the embodiments of the disclosure, constitute a part of the description, and are used to explain the disclosure in conjunction with the embodiments of the disclosure, and do not constitute a limitation on the disclosure. Like reference numerals generally refer to like components or steps throughout the figures.

DETAILED DESCRIPTION OF THE EMBODIMENTS

Figure 1A:
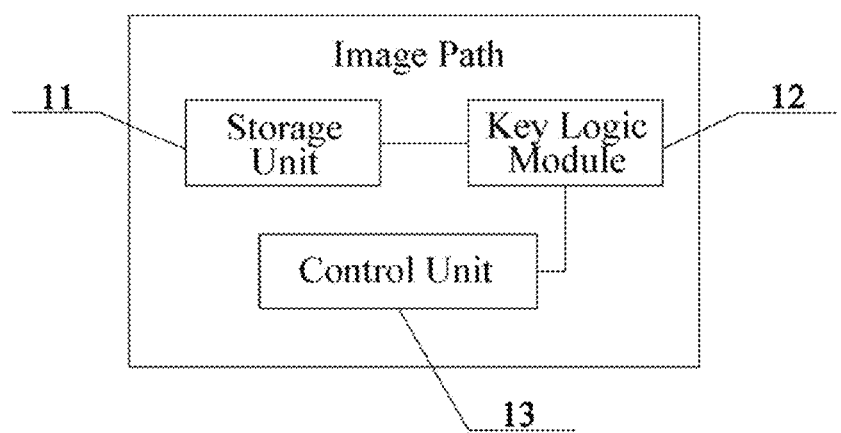
FIG. 1A is a schematic structural diagram of an image path.
Figure 1B:
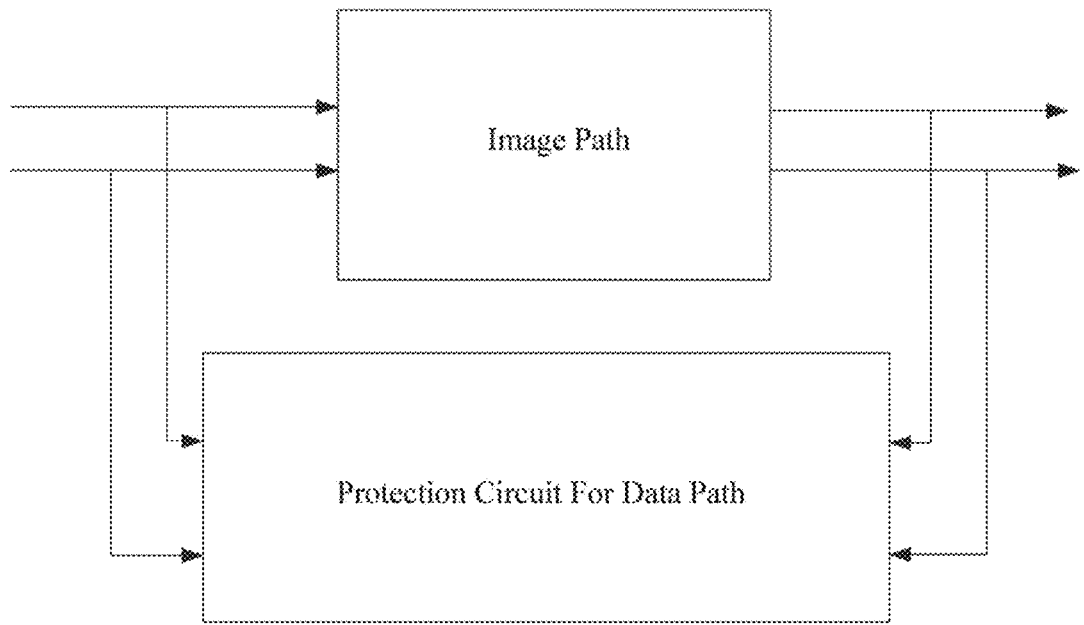
FIG. 1B is a schematic diagram of a scene to which an embodiment of the disclosure is applicable.

Exemplary embodiments of the disclosure will be described in detail below with reference to the accompanying drawings. Apparently, the described embodiments are merely part, not all, of the embodiments of the disclosure. It should be understood that the disclosure is not limited by the exemplary embodiments described herein.

It is to be noted that, relative arrangements, numerical expressions, and numerical values of components and steps set forth in these embodiments do not limit the scope of the disclosure, unless specifically described otherwise.

Those skilled in the art can understand that terms such as "first" and "second" used in the embodiments of the disclosure are used to just distinguish different steps, devices, or modules, which neither represent any specific technical meanings nor a necessary logical order between them.

It should also be understood that, in the embodiments of the disclosure, "a plurality" may refer to two or more, and "at least one" may refer to one, two, or more.

It should also be understood that any component, data or structure mentioned in the embodiments of the disclosure can generally be understood as one or more, unless specified explicitly otherwise or contrarily inspirated in the context.

In addition, in the disclosure, term "and/or" is only an association relationship describing associated objects and represents that three relationships may exist. For example, A and/or B may represent three conditions: presence of only A, presence of both A and B, and presence of only B. In addition, the symbol "/" used in the disclosure generally indicates an "or" relationship between the associated objects.

It should also be understood that, descriptions about the embodiments of the disclosure focus on differences between various embodiments, and the same or similar parts thereof may refer to each other, which will not be repeated herein for the sake of brevity.

Moreover, it should be understood that, for ease of description, sizes of various parts shown in the accompanying drawings are not necessarily to scale.

The following description of at least one exemplary embodiment is merely illustrative and is not construed as limiting this application or use of this application.

The technologies, methods, and devices known to those of ordinary skills in the related art may not be discussed in detail, but where appropriate, the technologies, methods, and devices should be regarded as a part of the description.

It is to be noted that similar reference signs and letters indicate similar items in the accompanying drawings, and therefore once an item is defined in one figure therein, it is not necessarily further discussed in the subsequent figures.

The embodiments of the disclosure can be applied to an electronic device such as a terminal device, a computer system and a server, which can be operated with numerous other general-purpose or special-purpose computing system environments or configurations. It is to be noted that the electronic device may include a System on Chip (SOC), and the SOC may include a Central Processing Unit (CPU), various other types of processors, various data processing paths, a memory, and the like; an operating system may be run on the SOC; the embodiments of the disclosure may be specifically applied inside the SOC; various electrical connections involved in the embodiments of the disclosure may be implemented inside the SOC; the various electrical connections involved in the embodiments of the disclosure may specifically be a metal wiring connection on a silicon chip inside the SOC; and all processing operations involved in the embodiments of the disclosure may be carried out inside the SOC. Examples of well-known terminal devices, computing systems, environments and/or configurations suitable for use with the electronic device such as a terminal device, a computer system, and a server include, but are not limited to: a device or system including automotive chips, a personal computer system, a server computer system, a thin client, a thick client, a handheld or laptop device, a microprocessor-based system, a set-top box, a programmable consumer electronic product, a networked personal computer, a minicomputer system, a mainframe computer system, a distributed cloud computing technology environment including any of the foregoing systems, and the like.

The electronic device such as a terminal device, a computer system and a server may be described in the general context of a computer system executable instruction (e.g., a program module) that is executed by the computer system. Generally, the program module may include a routine, a program, an object program, a component, logics, a data structure, or the like, which performs a particular task or implement a particular abstract data type. The computer system/server may be implemented in a distributed cloud computing environment where a task is performed by a remote processing device that is linked through a communication network. In the distributed cloud computing environment, the program module may be located on a local or remote computing system storage medium that contains a storage device.

Application Overview

During implementation of the disclosure, the inventor finds that with the development of technologies, a traditional data path can no longer meet requirements of system functional safety, for example, cannot meet requirements of ASILB, and corresponding circuits need to be added to protect the data path, where, ASILB refers to contents in ISO26262, which is an industry standard in the automotive industry.

Specifically, the data path may be an image path, an audio path, or the like. In the case where the data path is an image path, as shown in FIG. 1A, the image path may include a storage unit 11, a key logic module 12 and a control unit 13. The storage unit 11 may be configured to store data from the key logic module 12, and the control unit 13 may control a configuration of the key logic module 12. In order to realize protection for the image path, there is generally a need to add a circuit inside the image path to perform ECC protection for the storage unit 11, redundancy design protection for the key logic module 12, and register parity check protection for the control unit 13, thereby resulting in a relatively high hardware overhead of the circuit for protection for the image path.

Exemplary System

In order to solve the problem that the hardware overhead of the circuit mentioned in Application Overview is relatively high, as shown in FIG. 11B, a protection circuit for a data path according to an embodiment of the disclosure may be provided outside the image path. The protection circuit for the data path may run automatically after initialization of hardware is completed, so that protection for the data path is implemented with a low hardware overhead.

Exemplary Circuit

Figure 2:
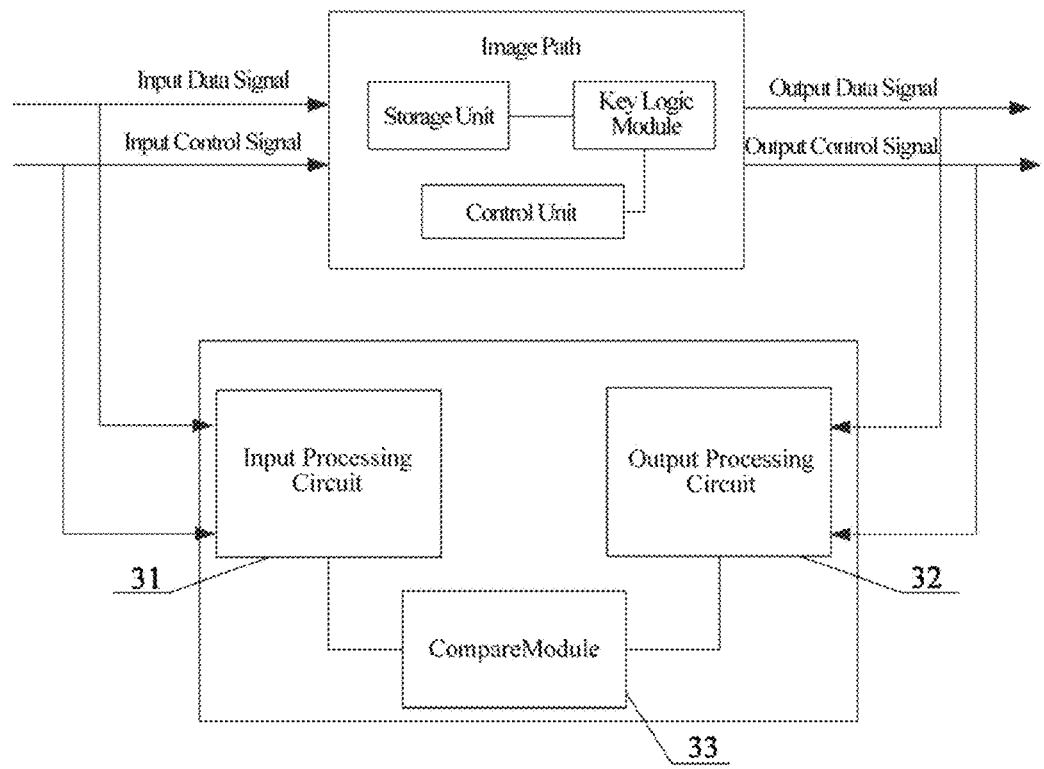
FIG. 2 is a schematic structural diagram of a protection circuit for a data path according to an exemplary embodiment of the disclosure.

FIG. 2 is a schematic structural diagram of a protection circuit for a data path according to an exemplary embodiment of the disclosure. As shown in FIG. 2, the protection circuit for the data path includes: an input processing circuit 31, an output processing circuit 32, and a comparison module 33.

The comparison module 33 is electrically connected to the input processing circuit 31 and the output processing circuit 32, respectively.

The input processing circuit 31 is configured to perform a check operation on an input data frame according to a preset check mode to obtain a first operation result.

The output processing circuit 32 is configured to perform a check operation on an output data frame corresponding to the input data frame according to the preset check mode to obtain a second operation result.

The comparison module 33 is configured to acquire the first operation result and the second operation result, and generate, based on the first operation result and the second operation result, a first error alarm signal for the data path.

For ease of understanding, in the embodiments of the disclosure, an image path is taken as an example of the data path for description. Correspondingly, the input data frame and the output data frame in the embodiments of the disclosure are both image frames.

Figure 3:
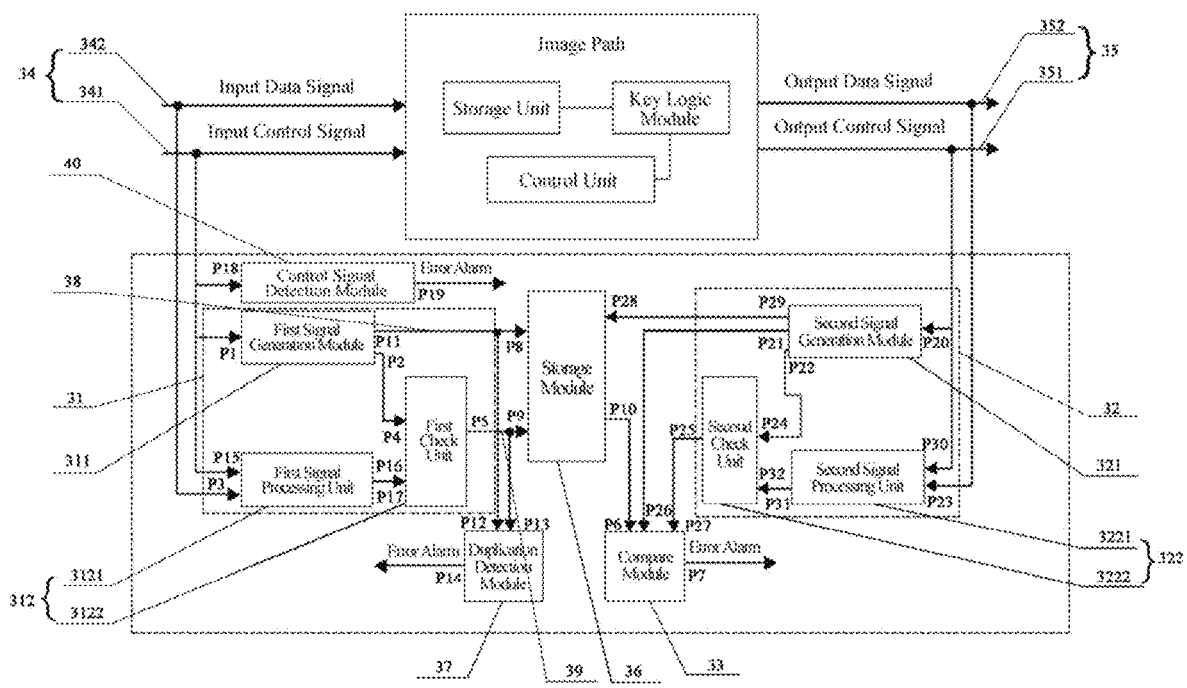
FIG. 3 is a schematic structural diagram of a protection circuit for a data path according to another exemplary embodiment of the disclosure.

Here, as shown in FIG. 2 and FIG. 3, the input processing circuit 31 and the output processing circuit 32 may also be electrically connected to a data bus of the data path, respectively.

In an embodiment of the disclosure, as shown in FIG. 3, the data bus of the data path may include an input data bus 34 and an output data bus 35. An input terminal (the left end shown in FIG. 3) of the data path may be electrically connected with the input data bus 34, an output terminal of the data path (the right end shown in FIG. 3) may be electrically connected with the output data bus 35, so that a signal may flow into the data path via the input data bus 34 and flow out of the data path via the output data bus 35. Optionally, the input data bus 34 may include: a control signal input data bus 341 and a data signal input data bus 342, which may be used for transmission of a control signal; the output data bus 35 may include: a control signal output data bus 351 and a data signal output data bus 352, which may be used for transmission of a data signal (specifically, an image signal here).

It is to be noted that the input processing circuit 31 may be specifically electrically connected with the input data bus 34, so that the input processing circuit 31 may acquire an input data frame from the input data bus 34. Then, the input processing circuit 31 may perform a check operation on the acquired input data frame according to a preset check mode to obtain a first operation result, for example, may perform, according to a preset Cyclic Redundancy Check (CRC) polynomial, a CRC operation on the acquired input data frame to obtain a corresponding CRC value as the first operation result.

The output processing circuit 32 may be electrically connected with the output data bus 35, so that the output processing circuit 32 may acquire an output data frame corresponding to the input data frame from the output data bus 35. It is to be noted that, in the embodiment of the disclosure, the input data frame and the output data frame may be in a one-to-one correspondence relation; the output data frame corresponding to any input data frame may be a data frame output from the data path based on the input data frame input to the data path. Then, the output processing circuit 32 may perform a check operation on the acquired output data frame according to the preset check mode to obtain a second operation result, for example, may perform, according to a preset CRC polynomial, a CRC operation on the acquired output data frame to obtain a corresponding CRC value as the second operation result.

Since the comparison module 33 is electrically connected to the input processing circuit 31 and the output processing circuit 32 respectively, the first operation result obtained by the input processing circuit 31 may be provided to the comparison module 33, and the second operation result obtained by the output processing circuit 32 may also be provided to the comparison module 33, the comparison module 33 may compare the first operation result with the second operation result, and generate a first error alarm signal for the data path when a comparison result does not meet a requirement.

In a specific implementation, the comparison module 33 may acquire a first operation result of an input data frame, acquire a second operation result of an output data frame corresponding to the input data frame, and compare the acquired first operation result with the second operation result. In the case where the acquired first operation result and the second operation result are different from each other, it can be considered that the comparison result does not meet the requirement, and it can be determined that an error has occurred in the data path. Then, the comparison module 33 may generate a first error alarm signal. The first error alarm signal may be output in the form of text, speech, lighting, and the like to notify the relevant personnel that an error has occurred in the data path, so that the relevant personnel can handle the error in time.

In another specific implementation, the comparison module 33 may acquire K first operation results of consecutive K (K is an integer greater than or equal to 2) input data frames, acquire K second operation results of K output data frames that are in one-to-one correspondence with the consecutive K input data frames, and pair the K first operation results and the K second operation results into K result pairs (each result pair includes the first operation result of one input data frame and the second operation result of one output data frame corresponding to the input data frame); and the comparison module 33 may further compare the first operation result with the second operation result for each result pair and determine whether they are the same as each other. When the result pairs in which the first operation results and the second operation results are not the same as each other among the result pairs exceed a preset ratio (e.g., 20% and 30%), it can be considered that the comparison result does not meet the requirement, then it can be determined that an error has occurred in the data path. At this point, the comparison module 33 may generate a first error alarm signal. The first error alarm signal may be output in the form of text, speech, lighting, and the like to notify the relevant personnel that an error has occurred in the data path, so that the relevant personnel can handle the error in time.

According to the protection circuit for the data path provided in the embodiments of the disclosure, the input processing circuit 31 may perform the check operation on the input data frame to obtain the first operation result, the output processing circuit 32 may perform the check operation on the output data frame corresponding to the input data frame to obtain the second operation result, and the comparison module 33 may generate, based on the first operation result and the second operation result, the first error alarm signal for the data path, thus, it is possible to find out an error occurred in the data path in time, and notify the relevant personnel of the error in time, so as to realize protection for the data path. It can be seen that, in the embodiments of the disclosure, through providing the protection circuit with a simple hardware structure, outside the data path, including the input processing circuit 31, the output processing circuit 32, and the comparison module 33 in conjunction with the check operation processing and use of the operation results, the first error alarm signal for the data path can be generated so as to effectively realize the protection for the data path, without separately protecting each part of the data path, inside the data path, and therefore, the protection for the data path can be realized with a low hardware overhead in the embodiments of the disclosure.

In an optional example, as shown in FIG. 3, the input processing circuit 31 includes: a first signal generation module 311 and a first processing module 312;

the first signal generation module 311 is electrically connected to the first processing module 312, and the first processing module 312 is further electrically connected to the comparison module 33;

the first signal generation module 311 is configured to generate and transmit an input frame end signal when it is determined, based on an input control signal, that the first processing module 312 has acquired a whole of the input data frame; and the first processing module 312 is configured to obtain and output the first operation result in response to the input frame end signal from the first signal generation module 311, so that the comparison module 33 acquires the first operation result.

Here, the first signal generation module 311 may have a first interface P1 and a second interface P2; the first processing module 312 may have a third interface P3, a fourth interface P4 and a fifth interface P5; the comparison module 33 may have a sixth interface P6 and the seventh interface P7. The first interface P1 may be electrically connected with the control signal input data bus 341, the second interface P2 may be electrically connected to the fourth interface P4, the third interface P3 may be electrically connected with the data signal input data bus 342, and the fifth interface P5 may be electrically connected to the six interface P6.

The third interface P3 is electrically connected with the data signal input data bus 342, so that the first processing module 312 may acquire an input data signal from the data signal input data bus 342. The first interface P1 is electrically connected with the control signal input data bus 341, so that the first signal generation module 311 may acquire the input control signal from the control signal input data bus 341. It is to be noted that the input control signal may carry information indicating a volume of valid data included in the input data frame, a transmission progress of the input data frame, and the like. Then, in conjunction with the data volume acquired by the first processing module 312 from the data signal input data bus 342 and the input control signal acquired from the control signal input data bus 341, it can be conveniently and reliably determined whether the first processing module 312 has acquired the whole of the input data frame from the data signal input data bus 342. In the case where a determination result is yes, the first signal generation module 311 may generate an input frame end signal, and output the input frame end signal via the second interface P2, and correspondingly, the first processing module 312 may acquire the input frame end signal via the fourth interface P4. Then, in response to the input frame end signal, the first processing module 312 may obtain the first operation result based on the CRC operation, and output the first operation result via the fifth interface P5. Correspondingly, the comparison module 33 may acquire the first operation result via the sixth interface P6, and perform comparison processing and generation of the first error alarm signal based on the first operation result. The comparison module 33 may also output the first error alarm signal via the seventh interface P7.

In the embodiment of the disclosure, the first signal generation module 311 in the input processing circuit 31 may effectively identify that the first processing module 312 has acquired the whole of the input data frame, and in this case, the first processing module 312 in the input processing circuit 31 is triggered by the input frame end signal to obtain and output the first operation result, so that the protection for the data path is realized. A hardware structure of the input processing circuit 31 is simple, which helps to reduce the hardware overhead.

In an optional example, as shown in FIG. 3, the protection circuit further includes: a storage module 36;

the storage module 36 is electrically connected to the first signal generation module 311, the first processing module 312 and the comparison module 33, respectively;

the first signal generation module 311 is further configured to generate and transmit a data write signal when it is determined, based on an input control signal, that the first processing module 312 has acquired the whole of the input data frame;

the first processing module 312 is configured to transmit the first operation result in response to the input frame end signal from the first signal generation module 311; and the storage module 36 is configured to store the first operation result from the first processing module 312 in response to the data write signal from the first signal generation module 311, and the storage module is further configured to transmit the first operation result.

Here, the storage module 36 may be a First Input First Output (FIFO) memory. The storage module 36 may have an eighth interface P8, a ninth interface P9 and a tenth interface P10. The first signal generation module 311 may also have an eleventh interface P11. The eighth interface P8 may be electrically connected to the eleventh interface P11, the ninth interface P9 may be electrically connected to the fifth interface P5, and the tenth interface P10 may be electrically connected to the sixth interface P6.

When it is determined that the first processing module 312 has acquired the whole of the input data frame from the data signal input data bus 342, the first signal generation module 311 may generate a data write signal, and output the data write signal via the eleventh interface P11. Correspondingly, the storage module 36 may acquire the data write signal via the eighth interface P8. In the case where the storage module 36 is the FIFO memory, the data write signal may also be referred to as a FIFO write signal.

In addition, the first processing module 312 may output the first operation result via the fifth interface P5 in response to the input frame end signal from the first signal generation module 311. Correspondingly, the storage module 36 may acquire the first operation result via the ninth interface P9, and the storage module 36 may latch the first operation result in response to the data write signal. The first operation result latched by the storage module 36 may be subsequently output via the tenth interface P10, so that the comparison module 33 acquires the first operation result via the sixth interface P6.

In the embodiment of the disclosure, the first signal generation module 311 may effectively identify that the first processing module 312 has acquired the whole of the input data frame, and in this case, the storage module 36 is triggered by the data write signal to latch the first operation result from the first processing module 312. The storage module 36 may subsequently provide the latched first operation result to the comparison module 33 according to needs, so as to realize the protection for the data path. The hardware structure of the entire protection circuit is simple, which helps to reduce the hardware overhead.

In an optional example, as shown in FIG. 3, the protection circuit further includes: a duplication detection module 37;

the duplication detection module 37 is electrically connected to the first signal generation module 311 and the storage module 36 through a first connection bus 38; and the duplication detection module 37 is also electrically connected to the first processing module 312 and the storage module 36 through a second connection bus 39; and the duplication detection module 37 is configured to generate a second error alarm signal for the data path when N consecutive data write signals are acquired from the first connection bus 38, N first operation results corresponding to the consecutive N data write signals are acquired from the second connection bus 39, and the number of the same operation results among the N first operation results and N satisfy a preset relation, where N is an integer greater than or equal to 2.

Here, the duplication detection module 37 may have a twelfth interface P12, a thirteenth interface P13 and a fourteenth interface P14, wherein the twelfth interface P12 is electrically connected with the first connection bus 38, and the thirteenth interface P13 is electrically connected with the second connection bus 39.

Here, N may be 2, 3, 4, 5 or an integer greater than 5. The number of the same operation results among the N first operation results and N satisfying the preset relation may refer to that an absolute value of a difference between the number of the same operation results among the N first operation results and N is less than or equal to a preset difference (e.g., 2 and 3); or, a ratio of the number of the same operation results among the N first operation results to N is greater than or equal to a preset ratio (e.g., 0.6, 0.7, and 0.8). Optionally, N may be 5, and it may be determined that the foregoing preset relation can be satisfied when the number of the same operation results among 5 first operation results is greater than 3.

The twelfth interface P12 is electrically connected with the first connection bus 38, so that each data write signal transmitted from the first signal generation module 311 to the storage module 36 can be acquired by the duplication detection module 37. The thirteenth interface P13 is electrically connected with the second connection bus 39, so that each first operation result transmitted from the first processing module 312 to the storage module 36 can be acquired by the duplication detection module 37. The duplication detection module 37 may perform statistical and analytical processing on the acquired data write signals and the first operation results, and may determine that an error of duplication of the input data frame occurs when it is determined that, through the statistical and analytical processing, consecutive N data write signals and N first operation results corresponding to the consecutive N data write signals have been acquired and the number of the same operation results among the N first operation results and N satisfy the preset relation. Then, the duplication detection module 37 may generate a second error alarm signal, and output the second error alarm signal via the fourteenth interface P14. Specifically, the second error alarm signal may be output in the form of text, speech, lighting, and the like to notify the relevant personnel that there is an error of duplication of the input data frame, so that the relevant personnel can handle the error in time.

In the embodiment of the disclosure, through provision of the duplication detection module 37, the error of duplication of the input data frame can be found in time, and may be notified to the relevant personnel in time, which facilitates the protection for the data path.

In an optional example, as shown in FIG. 3, the first processing module 312 includes: a first signal processing unit 3121 and a first check unit 3122;

the first signal processing unit 3121 is electrically connected to the first check unit 3122, and the first check unit 3122 is further electrically connected to the first signal generation module 311 and the comparison module 33, respectively;

the first signal processing unit 3121 is configured to perform, based on an input control signal, sampling and packaging on valid signals of input data signals, and transmit a first sampling and packaging result; and the first check unit 3122 is configured to generate, based on the first sampling and packaging result from the first signal processing unit 3121, the first operation result that is obtained through performing the check operation on the input data frame.

Here, the first signal processing unit 3121 may have a third interface P3, a fifteenth interface P15 and a sixteenth interface P16; and the first check unit 3122 may have a fourth interface P4, a fifth interface P5 and a seventeenth interface P17. The fifteenth interface P15 may be electrically connected with the control signal input data bus 341, the sixteenth interface P16 may be electrically connected to the seventeenth interface P17, and the fifth interface P5 may be electrically connected to the sixth interface P6.

The fifteenth interface P15 is electrically connected with the control signal input data bus 341, so that the first signal processing unit 3121 may acquire an input control signal via the fifteenth interface P15. The third interface P3 is electrically connected with the data signal input data bus 342, so that the first signal processing unit 3121 may acquire an input data signal from the third interface P3. It is to be noted that the input control signal may indicate which signals of the input data signals are valid signals and which signals are invalid signals. In this way, under the indication action of the input control signal, the first signal processing unit 3121 may sample only the valid signals of the input data signals, and package the sampled signal, for example, into a data structure required by the first check unit 3122, so as to obtain the first sampling and packaging result. Then, the first signal processing unit 3121 may output the first sampling and packaging result via the sixteenth interface P16, and correspondingly, the first check unit 3122 may acquire the first sampling and packaging result via the seventeenth interface P17. Based on the first sampling and packaging result, the first check unit 3122 may obtain the whole of the input image frame, and accordingly obtain the first operation result, and then output the first operation result via the fifth interface P5, so that the comparison module 33 may acquire the first operation result via the sixth interface P6.

In the embodiment of the disclosure, the first signal processing unit 3121 in the first processing module 312 may sample and package only the valid signals of the input data signals, and provide the first sampling and packaging result to the first check unit 3122 in the first processing module 312. The first check unit 3122 may generate the first operation result accordingly and provide the first operation result to the comparison module 33, so as to realize the protection for the data path. Since the invalid signals may not be processed in the embodiment of the disclosure, it can not only avoid possible interference caused by the invalid signals, but also save system resources and power. Moreover, a hardware structure of the first processing module 312 is simple, which helps to reduce the hardware overhead.

In an optional example, as shown in FIG. 3, the protection circuit further includes: a control signal detection module 40; and the control signal detection module 40 is configured to generate a third error alarm signal for the data path when the volume of valid data indicated by the information carried in an input control signal is different from a preset data volume, and/or a duration for frame transmission indicated by the information carried in the input control signal is greater than a preset duration.

Here, the control signal detection module 40 may have an eighteenth interface P18 and a nineteenth interface P19, and the eighteenth interface P18 may be electrically connected with the control signal input data bus 341.

Here, each input control signal may carry information such as the volume of valid data and the duration for frame transmission. The volume of valid data is the volume of valid data contained in a single input data frame, and the duration for frame transmission is a duration required for transmission of a single input data frame.

The eighteenth interface P18 is electrically connected with the control signal input data bus 341, so that the control signal detection module 40 may acquire an input control signal via the eighteenth interface P18. Then, the control signal detection module 40 may extract the volume of valid data and the duration for frame transmission from the acquired input control signal, compare the extracted volume of valid data with the preset data volume, and compare the extracted duration for frame transmission with the preset duration. When the extracted volume of valid data is different from the preset data volume, and/or the extracted duration for frame transmission is greater than the preset duration, it can be determined that an error of data volume abnormity and/or data frame loss occurs. At this point, the control signal detection module 40 may generate and output a third error alarm signal via the nineteenth interface P19. The third error alarm signal may be output in the form of text, speech, lighting, and the like to notify the relevant personnel that the error of data volume abnormity and/or data frame loss occurs, so that the relevant personnel can handle the error in time.

In the embodiment of the disclosure, through provision of the control signal detection module 40, the error of data volume abnormity and/or data frame loss can be found in time, and will be notified to the relevant personnel in time, which facilitates the protection for the data path.

In an optional example, as shown in FIG. 3, the output processing circuit 32 includes: a second signal generation module 321 and a second processing module 322;

the second signal generation module 321 is electrically connected to the second processing module 322 and the comparison module 33, respectively, and the second processing module 322 is further electrically connected to the comparison module 33;

the second signal generation module 321 is configured to generate and transmit an output frame end signal and a comparison enable signal when it is determined, based on an output control signal, that the second processing module 322 has acquired the whole of the output data frame;

the second processing module 322 is configured to obtain and transmit the second operation result in response to the output frame end signal from the second signal generation module 321; and the comparison module 33 is configured to compare the first operation result with the second operation result in response to the comparison enable signal from the second signal generation module 321, and generate a first error alarm signal when a comparison result is that the first operation result and the second operation result do not match with each other.

Here, the second signal generation module 321 may have a twentieth interface P20, a twenty-first interface P21 and a twenty-second interface P22; the second processing module 322 may have a twenty-third interface P23, a twenty-fourth interface P24 and the twenty-fifth interface P25; and the comparison module 33 may have a seventh interface P7, a twenty-sixth interface P26 and a twenty-seventh interface P27. The twentieth interface P20 may be electrically connected with the control signal output data bus 351, the twenty-first interface P21 may be electrically connected to the twenty-sixth interface P26, the twenty-second interface P22 may be electrically connected to the twenty-fourth interface P24, the twenty-third interface P23 may be electrically connected with the data signal output data bus 352, and the twenty-fifth interface P25 may be electrically connected to the twenty-seventh interface P27.

The twenty-third interface P23 is electrically connected with the data signal output data bus 352, so that the second processing module 322 may acquire an output data signal from the data signal output data bus 352. The twentieth interface P20 is electrically connected with the control signal output data bus 351, so that the second signal generation module 321 may acquire an output control signal from the control signal output data bus 351. It is to be noted that the output control signal may carry information indicating the amount of valid information, a transmission progress of the output data frame, and the like that are included in the output data frame; and then, in conjunction with the volume of data acquired by the second processing module 322 from the data signal output data bus 352 and the output control signal acquired from the control signal output data bus 351, it can be conveniently and reliably determined whether the second processing module 322 has acquired the whole of the output data frame from the data signal output data bus 352. If the determination result is yes, the second signal generation module 321 may generate an output frame end signal and a comparison enable signal, output the comparison enable signal via the twenty-first interface P21, and output the output frame end signal via the twenty-second interface P22; and correspondingly, the comparison module 33 may acquire the comparison enable signal via the twenty-sixth interface P26, and the second processing module 322 may acquire the output frame end signal via the twenty-fourth interface P24.

Then, the second processing module 322 may obtain the second operation result in response to the output frame end signal, and output the second operation result via the twenty-fifth interface P25, and correspondingly, the comparison module 33 may acquire the second operation result via the twenty-seventh interface P27. In addition, the comparison module 33 may also compare the first operation result with the second operation result in response to the comparison enable signal to determine whether the first operation result and the second operation result match with each other. It should be pointed out that the case that a comparison result does not satisfy the requirement in the above may be regarded as a case that the first operation result and the second operation result do not match with each other. When the comparison result is that the first operation result and the second operation result do not match with each other, the comparison module 33 may generate a first error alarm signal.

In the embodiment of the disclosure, the second signal generation module 321 in the output processing circuit 32 may effectively identify that the second processing module 322 in the output processing circuit 32 acquires the whole of the output data frame, and in this case, the second processing module 322 is triggered by the output frame end signal to obtain and transmit the second operation result, and the comparison module 33 is triggered by the comparison enable signal to perform comparison processing, so that the protection for the data path is realized. A hardware structure of the output processing circuit 32 is simple, which helps to reduce the hardware overhead.

In an optional example, as shown in FIG. 3, the protection circuit further includes: a storage module 36;

the storage module 36 is electrically connected to the input processing circuit 31, the comparison module 33 and the second signal generation module 321, respectively;

the input processing circuit 31 is further configured to transmit the first operation result;

the storage module 36 is configured to store the first operation result from the input processing circuit 31;

the second signal generation module 321 is further configured to generate and transmit a data read signal when it is determined, based on the output control signal, that the second processing module 322 has acquired the whole of the output data frame;

the storage module 36 is further configured to read and transmit the stored first operation result in response to the data read signal from the second signal generation module 321.

Here, the storage module 36 may be a FIFO memory, the storage module 36 may have a ninth interface P9, a tenth interface P10 and a twenty-eighth interface P23, the comparison module 33 may have a sixth interface P6; and the second signal generation module 321 may have a twenty-ninth interface P29. The ninth interface P9 may be electrically connected to the fifth interface P5 of the input processing circuit 31, the tenth interface P10 may be electrically connected to the sixth interface P6, and the twenty-eighth interface P28 may be electrically connected to the twenty-ninth interface.

The ninth interface P9 is electrically connected to the fifth interface P5, so that the storage module 36 may acquire the first operation result from the input processing circuit 31 through the ninth interface P9, and the storage module 36 may latch the received first operation result. In addition, when it is determined that the second processing module 322 has acquired the whole of the output data frame from the data signal output data bus 352, the second signal generation module 321 may generate a data read signal and output the data read signal via the twenty-ninth interface P29. Correspondingly, the storage module 36 may acquire the data read signal from the twenty-eighth interface P28. In response to the data read signal, the storage module 36 may read the stored first operation result, and output the first operation result via the tenth interface P10, so that the comparison module 33 can acquire the first operation result via the sixth interface P6.

It can be seen that, in the embodiment of the disclosure, the second signal generation module 321 may effectively identify that the second processing module 322 has acquired the whole of the output data frame, and in this case, the storage module 36 is triggered by the data read signal to read and provide the latched first operation result to the comparison module 33, so that the protection for the data path is realized. A hardware structure of the entire protection circuit is simple, which helps to reduce the hardware overhead.

In an optional example, as shown in FIG. 3, the second processing module 322 includes: a second signal processing unit 3221 and a second check unit 3222;

the second signal processing unit 3221 is electrically connected to the second check unit 3222, and the second check unit 3222 is further electrically connected to the second signal generation module 321 and the comparison module 33, respectively;

the second signal processing unit 3221 is configured to perform, based on an output control signal, sampling and packaging on valid signals of output data signals, and transmit a second sampling and packaging result; and the second check unit 3222 is configured to generate, based on the second sampling and packaging result from the second signal processing unit 3221, the second operation result that is obtained through performing the check operation on the output data frame.

Here, the second signal processing unit 3221 may have a twenty-third interface P23, a thirtieth interface P30, and a thirty-first interface P31, the second check unit 3222 may have a twenty-fourth interface P24, a twenty-fifth interface P25 and a thirty-second interface P32, and the comparison module 33 may have a twenty-seventh interface P27. The twenty-third interface P23 may be electrically connected with the data signal output data bus 352, the thirtieth interface P30 may be electrically connected with the control signal output data bus 351, the thirty-first interface P31 may be electrically connected to the thirty-second interface P32, and the twenty-fifth interface P25 may be electrically connected to the twenty-seventh interface P27.

The thirtieth interface P30 is electrically connected with the control signal output data bus 351, so that the second signal processing unit 3221 may acquire an output control signal via the thirtieth interface P30. The twenty-third interface P23 is electrically connected with the data signal output data bus 352, so that the second signal processing unit 3221 may acquire an output data signal via the twenty-third interface P23. It is to be noted that the output control signal may indicate which signals of the output data signals are valid signals and which signals are invalid signals. In this way, under the indication action of the output control signal, the second signal processing unit 3221 may sample only the valid signals of the output data signals, and package the sampled signal, for example, into a data structure required by the second check unit 3222, so as to obtain the second sampling and packaging result. Then, the second signal processing unit 3221 may output the second sampling and packaging result via the thirty-first interface P31, and correspondingly, the second checking unit 3222 may acquire the second sampling and packaging result via the thirty-second interface P32. Based on the second sampling and packaging result, the second check unit 3222 may obtain the whole of the output image frame, and thereby obtain and output the second operation result via the twenty-fifth interface P25, so that the comparison module 33 can obtain the second operation result via the twenty-seventh interface P27.

In the embodiment of the disclosure, the second signal processing unit 3221 in the second processing module 322 may sample and package only valid signals of the output data signals, and provide the second sampling and packaging result to the second check unit 3222 in the second processing module 322. The second check unit 3222 may generate and provide the second operation result accordingly to the comparison module 33, so as to realize the protection for the data path. Since the invalid signals may not be processed in the embodiment of the disclosure, it can not only avoid possible interference caused by the invalid signals, but also save system resources and power. Moreover, a hardware structure of the second processing module 322 is simple, which helps to reduce the hardware overhead.

To sum up, With the protection circuit for the data path provided by the embodiments of the disclosure, the situations can be easily and reliably identified that an error in the data path, an error of duplication of the input data frame, the data volume abnormity, and an error of data frame loss occur, and these situations can be notified to the relevant personnel in time, so that the protection for the data path can be realized with as low hardware overhead as possible, and the coverage of error diagnosis can be effectively increased, thereby meeting the requirement of system functional safety.

Exemplary Method

Figure 4:
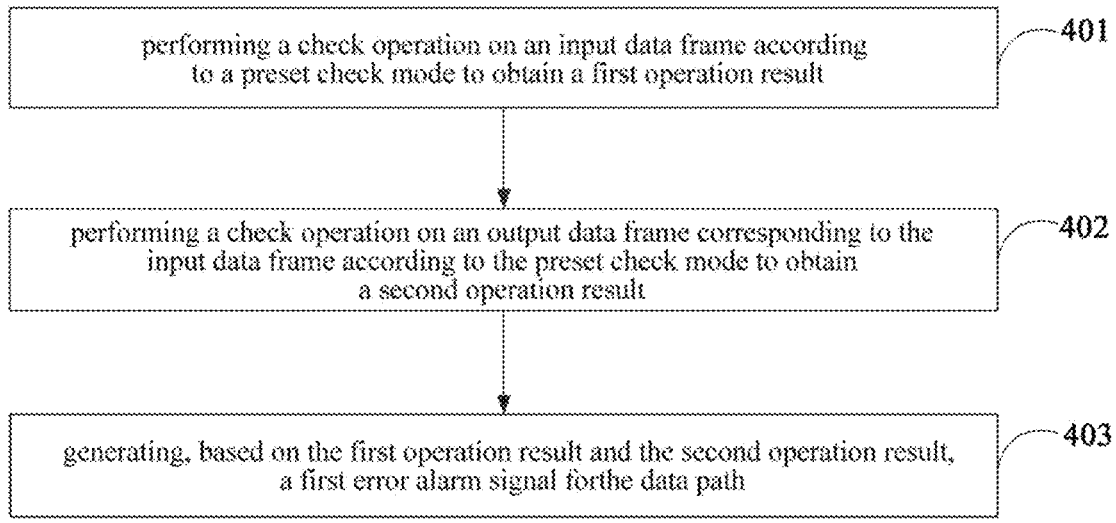
FIG. 4 is a schematic flowchart of a protection method for a data path according to an exemplary embodiment of the disclosure.

FIG. 4 is a schematic flowchart of a protection method for a data path according to an exemplary embodiment of the disclosure. The method shown in FIG. 4 includes Step 401, Step 402 and Step 403.

Step 401, performing a check operation on an input data frame according to a preset check mode to obtain a first operation result;

Step 402, performing a check operation on an output data frame corresponding to the input data frame according to the preset check mode to obtain a second operation result;

Step 403, generating, based on the first operation result and the second operation result, a first error alarm signal for the data path.

Figure 5:
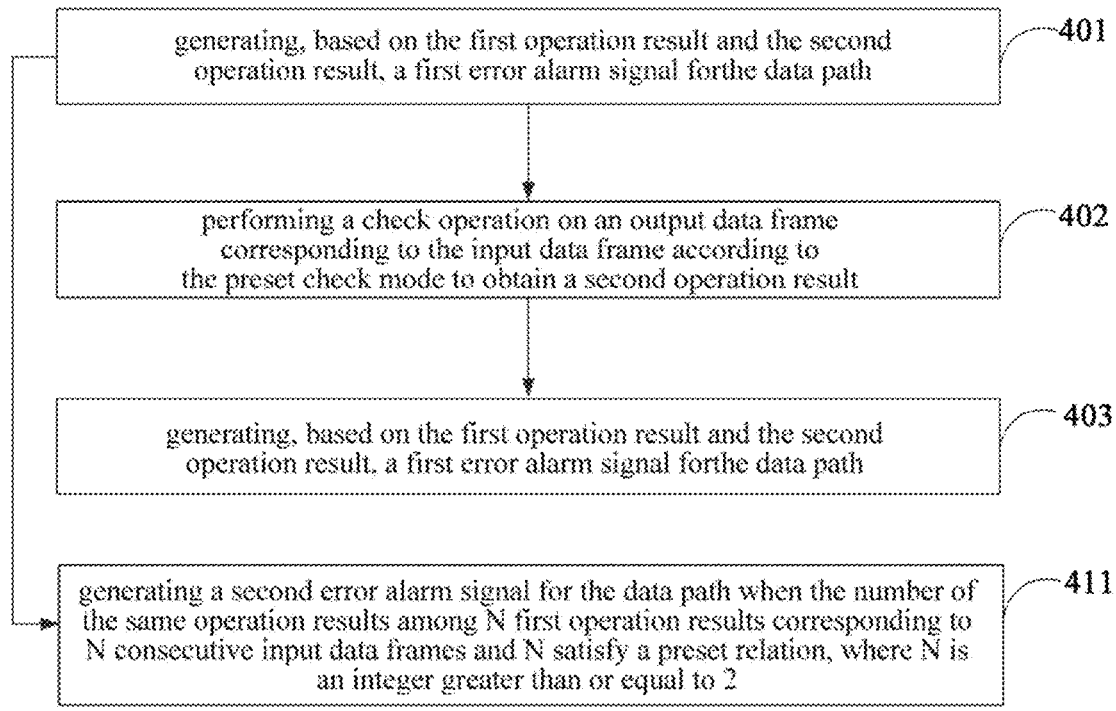
FIG. 5 is a schematic flowchart of a protection method for a data path according to another exemplary embodiment of the disclosure.

In an optional example, as shown in FIG. 5, the method further includes:

Step 411, generating a second error alarm signal for the data path when the number of the same operation results among N first operation results corresponding to N consecutive input data frames and N satisfy a preset relation, where N is an integer greater than or equal to 2.

Figure 6:
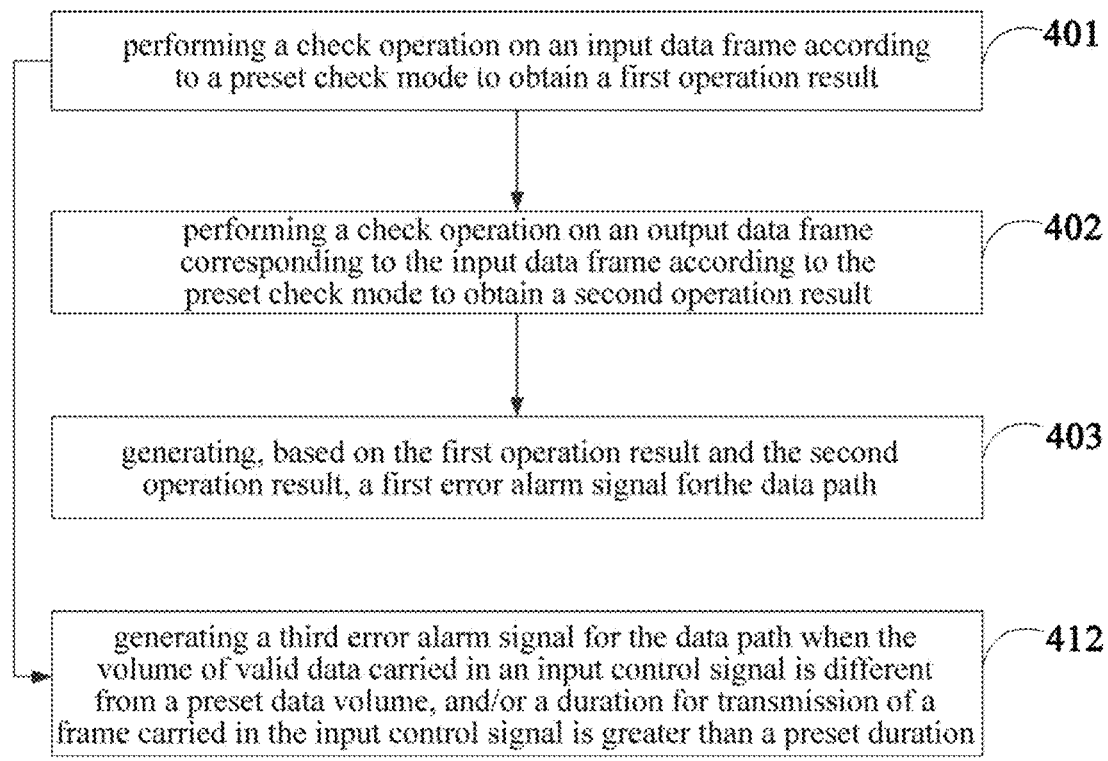
FIG. 6 is a schematic flowchart of a protection method for a data path according to still another exemplary embodiment of the disclosure.

In an optional example, as shown in FIG. 6, the method further includes:

Step 412, generating a third error alarm signal for the data path when the volume of valid data carried in an input control signal is different from a preset data volume, and/or a duration for frame transmission carried in the input control signal is greater than a preset duration.

It is to be noted that, in the embodiment of the disclosure, the execution order of Step 412 and any one of Steps 401 to 403 is not limited.

Any protection method for the data path provided by the embodiments of the disclosure may be executed by any appropriate device having data processing capabilities, including, but being not limited to: a terminal device, a server, and the like. Or, any protection method for the data path provided by the embodiments of the disclosure may be executed by a processor, for example, the processor executes any of the protection methods for the data path mentioned in the embodiments of the disclosure by calling corresponding instructions stored in a memory. The description thereof is not repeated below.

Exemplary Apparatus

Figure 7:
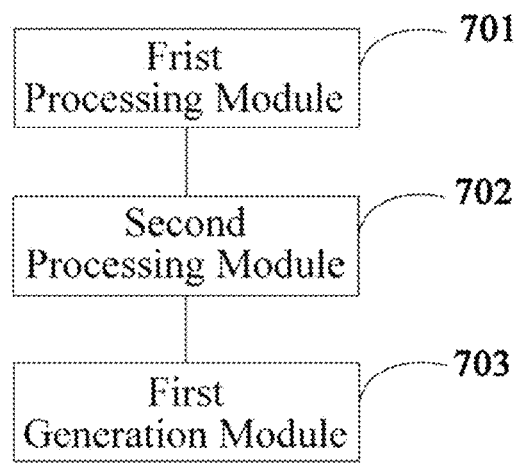
FIG. 7 is a schematic structural diagram of a protection apparatus for a data path according to an exemplary embodiment of the disclosure.

FIG. 7 is a schematic structural diagram of a protection apparatus for a data path according to an exemplary embodiment of the disclosure. The apparatus shown in FIG. 7 includes a first processing module 701, a second processing module 702, and a first generation module 703.

The first processing module 701 is configured to perform a check operation on an input data frame according to a preset check mode to obtain a first operation result.

The second processing module 702 is configured to perform a check operation on an output data frame corresponding to the input data frame according to the preset check mode to obtain a second operation result.

The first generation module 703 is configured to generate, based on the first operation result generated from the first processing module 701 and the second operation result generated from the second processing module 702, a first error alarm signal for the data path.

Figure 8:
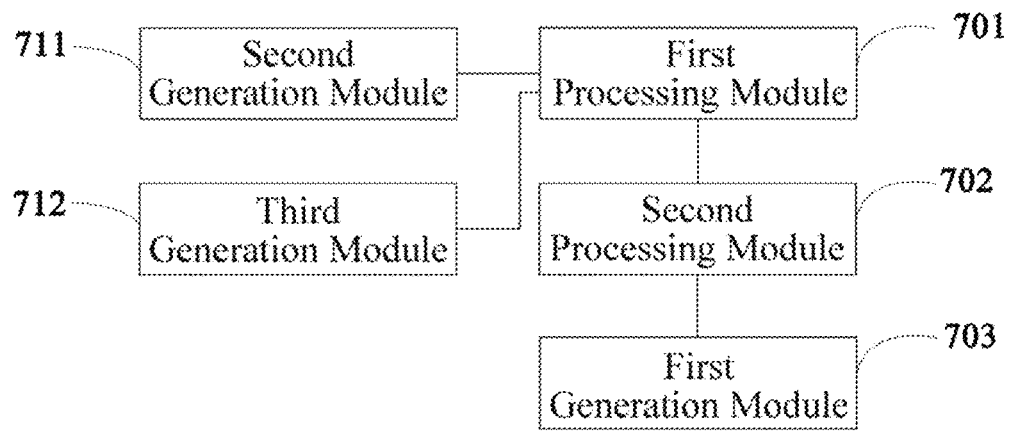
FIG. 8 is a schematic structural diagram of a protection apparatus for a data path according to another exemplary embodiment of the disclosure.

In an optional example, as shown in FIG. 8, the apparatus further includes:

a second generation module 711, configured to generate a second error alarm signal for the data path when the number of the same operation results among N first operation results corresponding to N consecutive input data frames and N satisfy a preset relation, where N is an integer greater than or equal to 2.

In an optional example, as shown in FIG. 8, the apparatus further includes:

a third generation module 712, configured to generate a third error alarm signal for the data path when the volume of valid data carried in an input control signal is different from a preset data volume, and/or a duration for frame transmission carried in the input control signal is greater than a preset duration.

Exemplary Electronic Device

Figure 9:
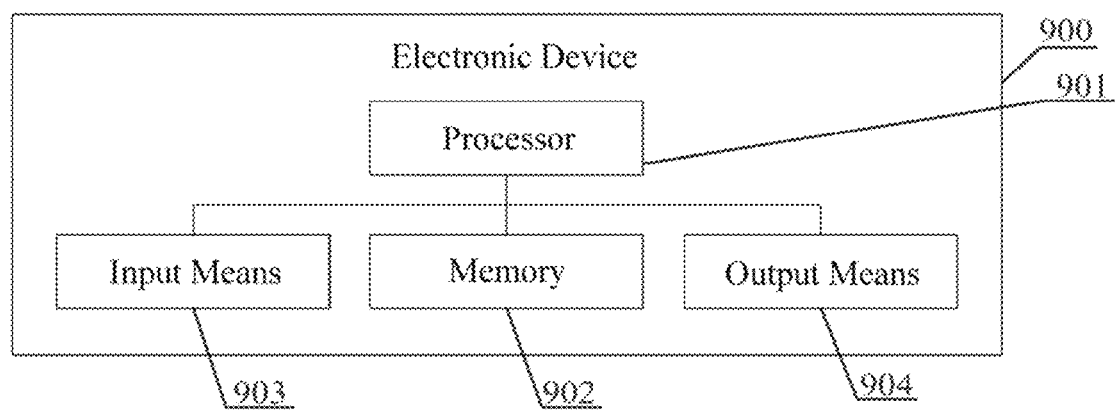
FIG. 9 is a structural diagram of an electronic device according to an exemplary embodiment of the disclosure.

An electronic device according to an embodiment of the disclosure will be described below with reference to FIG. 9. FIG. 9 is a block diagram of an electronic device according to an embodiment of the disclosure.

As shown in FIG. 9, the electronic device 900 includes one or more processors 901 and a memory 902.

The processor 901 may be a central processing unit (CPU) or other form of processing unit having data processing capabilities and/or instruction execution capabilities, and may control other components in the electronic device 900 to perform desired functions.

The memory 902 may include one or more computer program products, which may include various forms of computer-readable storage media, such as a volatile memory and/or a non-volatile memory. The volatile memory may include, for example, a random access memory (RAM) and/or a cache memory. The non-volatile memory may include, for example, a read only memory (ROM), a hard disk, and a flash memory. One or more computer program instructions may be stored on the computer-readable storage medium, and the processor 901 may execute the program instructions to implement the protection method for the data path in each embodiment of the disclosure described above, and/or other desired functions. Various contents such as input signals, signal components, and noise components may also be stored in the computer-readable storage medium.

In an example, the electronic device 900 may also include an input means 903 and an output means 904, and these components are interconnected by a bus system and/or other form of connection mechanism (not shown).

For example, the input means 903 may be a microphone or a microphone array, or the input means may be a communication network connector.

In addition, the input means 903 may also include, for example, a keyboard, a mouse, and so on.

The output means 904 may output various information to the outside, including the determined error alarm signals (e.g., the first error alarm signal, the second error alarm signal, and/or the third error alarm signal), and the like. The output means 904 may include, for example, a display, a speaker, a printer, and a communication network and a remote output device connected thereto.

Of course, for simplicity, only part of the components in the electronic device 900 related to the disclosure are shown in FIG. 9, and components such as a bus, and an input/output interface are omitted. Besides, the electronic device 900 may also include any other suitable components according to specific applications.

Exemplary Computer Program Product and Computer Readable Storage Medium

In addition to the above-described method and apparatus, the embodiments of the present disclosure may also refer to a computer program product, which includes a computer program instruction that, when executed by a processor, cause the processor to perform the steps of the protection method for the data path in each embodiment of the disclosure that is described in the "Exemplary Method" section of this description.

The computer program product may be program code, written with one or any combination of a plurality of programming languages that is configured to perform the operations in the embodiments of the present disclosure. The programming languages include an object-oriented programming language such as Java or C++, and further include a conventional procedural programming language such as a "C" language or a similar programming language. The program code may be entirely or partially executed on a user computing device, executed as an independent software package, partially executed on the user computing device and partially executed on a remote computing device, or entirely executed on the remote computing device or a server.

Furthermore, the embodiments of the present disclosure may also provide a computer-readable storage medium having a computer program instruction stored thereon that, when executed by a processor, cause the processor to perform the steps of the protection method for the data path in each embodiment of the disclosure that is described in the "Exemplary Method" section of this description.

The computer readable storage medium may be one readable medium or any combination of a plurality of readable media. The readable medium may be a readable signal medium or a readable storage medium. The readable storage medium may include, for example, but not limited to electricity, magnetism, light, electromagnetism, infrared ray, or a semiconductor system, apparatus or device, or any combination of the above. More specific examples (a non-exhaustive list) of the readable storage medium include: an electrical connection with one or more conducting wires, a portable disk, a hard disk, a random access memory (RAM), a read-only memory (ROM), an erasable programmable read-only memory (EPROM or flash memory) or a flash memory, an optical fiber, a portable compact disk read-only memory (CD-ROM), an optical storage device, a magnetic storage device, or any suitable combination of the above.

Basic principles of the present disclosure are described above in combination with the specific embodiments. However, it should be pointed out that the advantages, superiorities, and effects mentioned in the present disclosure are merely examples but are not for limitation, and it cannot be considered that these advantages, superiorities, and effects are necessary for each embodiment of the present disclosure. In addition, specific details of the above disclosure are merely for examples and for ease of understanding, rather than limitations. The foregoing details do not limit that the present disclosure must be implemented by using the foregoing specific details.

The various embodiments in this specification are all described in a progressive way, and each embodiment focuses on a difference from other embodiments. For same or similar parts among the various embodiments, reference may be made to each other. The system embodiments basically correspond to the method embodiments, and thus are relatively simply described. For related parts, reference may be made to a part of the descriptions of the method embodiments.

The block diagrams of the equipment, the apparatus, the device, and the system involved in the present disclosure are merely exemplary examples and are not intended to require or imply that the equipment, the apparatus, the device, and the system must be connected, arranged, and configured in the manners shown in the block diagrams. It is recognized by a person skilled in the art that, the equipment, the apparatus, the device, and the system may be connected, arranged, and configured in an arbitrary manner. The terms such as "include", "contain", and "have" are open terms that mean "including but not limited to", and may be used interchangeably with "including but not limited to". The terms "or" and "and" used herein refer to the term "and/or", and may be used interchangeably with "and/or", unless the context clearly indicates otherwise. The term "such as" used herein refers to the phrase "such as but not limited to", and may be used interchangeably with "such as but not limited to".

The method and the apparatus in the present disclosure may be implemented in many ways. For example, the method and the apparatus in the present disclosure may be implemented by software, hardware, firmware, or any combination of the software, the hardware, and the firmware. The foregoing sequence of the steps of the method is for illustration only, and the steps of the method in the present disclosure are not limited to the sequence specifically described above, unless otherwise specifically stated in any other manner. In addition, in some embodiments, the present disclosure may also be implemented as programs recorded in a recording medium. These programs include machine-readable instructions for implementing the method according to the present disclosure. Therefore, the present disclosure further relates to a recording medium storing a program for implementing the method according to the present disclosure.

It should be further pointed out that, various components or various steps in the apparatus, the device, and the method of the present disclosure may be disassembled and/or recombined. These disassembled and/or recombined components or steps shall be regarded as equivalent solutions of the present disclosure.

The foregoing description about the disclosed aspects is provided, so that the present disclosure can be arrived at or carried out by any person skilled in the art. Various modifications to these aspects are very obvious to a person skilled in the art. Moreover, general principles defined herein may be applicable to other aspects without departing from the scope of the present disclosure. Therefore, the present disclosure is not intended to be limited to the aspect illustrated herein, but to the widest scope consistent with the principles and novel features disclosed herein.

The foregoing description has been given for illustration and description. In addition, this description is not intended to limit the embodiments of the present disclosure to forms disclosed herein. Although a plurality of exemplary aspects and embodiments have been discussed above, a person skilled in the art may recognize certain variations, modifications, changes, additions, and sub-combinations thereof.

The invention claimed is:

1. A protection circuit for a data path, including an input processing circuit, an output processing circuit, and a comparison module; wherein
the input processing circuit is electrically connected with the input data bus of the data path, the output processing circuit is electrically connected with the output data bus of the data path, an input terminal of the data path is electrically connected with the input data bus, and an output terminal of the data path is electrically connected with the output data bus;
the comparison module is electrically connected to the input processing circuit and the output processing circuit, respectively;
the input processing circuit is configured to perform a check operation on an input data frame obtained from the input data bus according to a preset check mode to obtain a first operation result;
the output processing circuit is configured to perform a check operation on an output data frame obtained from the output data bus and corresponding to the input data frame according to the preset check mode to obtain a second operation result; and
the comparison module is configured to acquire the first operation result and the second operation result, and generate a first error alarm signal for the data path based on the first operation result and the second operation result.

2. The protection circuit according to claim 1, wherein the input processing circuit includes a first signal generation module and a first processing module;
the first signal generation module is electrically connected to the first processing module, and the first processing module is further electrically connected to the comparison module;
the first signal generation module is configured to generate and transmit an input frame end signal when it is determined, based on an input control signal, that the first processing module has acquired a whole of the input data frame; and
the first processing module is configured to obtain and output the first operation result in response to the input frame end signal from the first signal generation module, so that the comparison module acquires the first operation result.

3. The protection circuit according to claim 2, wherein the protection circuit further includes a storage module;
the storage module is electrically connected to the first signal generation module, the first processing module, and the comparison module, respectively;
the first signal generation module is further configured to generate and transmit a data write signal when it is determined, based on the input control signal, that the first processing module has acquired the whole of the input data frame;
the first processing module is configured to transmit the first operation result in response to the input frame end signal from the first signal generation module; and
the storage module is configured to store the first operation result from the first processing module in response to the data write signal from the first signal generation module, and the storage module is further configured to transmit the first operation result.

4. The protection circuit according to claim 2, wherein the first processing module includes a first signal processing unit and a first check unit;
the first signal processing unit is electrically connected to the first check unit, and the first check unit is further electrically connected to the first signal generation module and the comparison module, respectively;
the first signal processing unit is configured to perform, based on the input control signal, sampling and packaging on valid signals of the input data signals, and transmit a first sampling and packaging result; and the first check unit is configured to generate, based on the first sampling and packaging result from the first signal processing unit, the first operation result that is obtained through performing the check operation on the input data frame.

5. The protection circuit according to claim 1, wherein the protection circuit further includes a control signal detection module; and the control signal detection module is configured to generate a third error alarm signal for the data path when a volume of valid data carried in the input control signal is different from a preset data volume, and/or a duration for frame transmission carried in the input control signal is greater than a preset duration.

6. The protection circuit according to claim 1, wherein the output processing circuit includes a second signal generation module and a second processing module;

the second signal generation module is electrically connected to the second processing module and the comparison module, respectively, and the second processing module is further electrically connected to the comparison module;

the second signal generation module is configured to generate and transmit an output frame end signal and a comparison enable signal when it is determined, based on an output control signal, that the second processing module has acquired a whole of the output data frame;

the second processing module is configured to obtain and transmit the second operation result in response to the output frame end signal from the second signal generation module; and the comparison module is configured to compare the first operation result with the second operation result in response to the comparison enable signal from the second signal generation module, and generate the first error alarm signal when a comparison result is that the first operation result and the second operation result do not match with each other.

7. The protection circuit according to claim 6, wherein the protection circuit further includes a storage module;

the storage module is electrically connected to the input processing circuit, the comparison module, and the second signal generation module, respectively;

the input processing circuit is further configured to transmit the first operation result;

the storage module is configured to store the first operation result from the input processing circuit;

the second signal generation module is further configured to generate a data read signal and transmit when it is determined, based on the output control signal, that the second processing module has acquired the whole of the output data frame; and the storage module is further configured to read and transmit the stored first operation result in response to the data read signal from the second signal generation module.

8. A protection method for a data path, including steps of:

electrically connecting an input processing circuit with an input data bus of a data path;

electrically connecting an output processing circuit with an output data bus of the data path;

electrically connecting an input terminal of the data path with the input data bus;

electrically connecting an output terminal of the data path with the output data bus;

performing a check operation on an input data frame obtained from the input data bus according to a preset check mode to obtain a first operation result;

performing a check operation on an output data frame obtained from the output data bus and corresponding to the input data frame according to the preset check mode to obtain a second operation result; and generating a first error alarm signal for the data path based on the first operation result and the second operation result.

9. The protection method according to claim 8, further including steps of:

generating a second error alarm signal for the data path when the number of the same operation results among N first operation results corresponding to N consecutive input data frames and N satisfy a preset relation, where N is an integer greater than or equal to 2;

and/or generating a third error alarm signal for the data path when a volume of valid data carried in an input control signal is different from a preset data volume, and/or a duration for frame transmission carried in the input control signal is greater than a preset duration.

10. The protection method according to claim 8, wherein the step of performing a check operation on an input data frame according to a preset check mode to obtain a first operation result includes:

generating and transmitting an input frame end signal when it is determined, based on an input control signal, that a whole of the input data frame has been acquired; and performing, based on the input control signal, sampling and packaging on valid signals of the input data signals, and transmitting a first sampling and packaging result; and generating, based on the first sampling and packaging result, the first operation result that is obtained through performing the check operation on the input data frame.

11. A computer readable storage medium, in which a computer program is stored and used for implementing the protection method for the data path according to claim 8.

12. An electronic device, including:

a processor; and a memory, configured to store a processor-executable instruction; wherein the processor is configured to read the executable instruction from the memory and execute the instruction to implement the protection method for the data path according to claim 8.

13. The electronic device according to claim 12, wherein the protection method further includes steps of:

generating a second error alarm signal for the data path when the number of the same operation results among N first operation results corresponding to N consecutive input data frames and N satisfy a preset relation, where N is an integer greater than or equal to 2;

and/or generating a third error alarm signal for the data path when a volume of valid data carried in an input control signal is different from a preset data volume, and/or a duration for frame transmission carried in the input control signal is greater than a preset duration.

14. The electronic device according to claim 13, wherein the step of performing a check operation on an input data frame according to a preset check mode to obtain a first operation result includes:

generating and transmitting an input frame end signal when it is determined, based on an input control signal, that a whole of the input data frame has been acquired; and performing, based on the input control signal, sampling and packaging on valid signals of the input data signals, and transmitting a first sampling and packaging result; and generating, based on the first sampling and packaging result, the first operation result that is obtained through performing the check operation on the input data frame.

15. The electronic device according to claim 14, wherein the step of performing a check operation on an output data frame corresponding to the input data frame according to the preset check mode to obtain a second operation result includes:

generate and transmit an output frame end signal and a comparison enable signal when it is determined, based on an output control signal, that a whole of the output data frame has been acquired;

performing, based on the output control signal, sampling and packaging on valid signals of the output data signals, and transmitting a second sampling and packaging result; and generating, based on the second sampling and packaging result, the second operation result that is obtained through performing the check operation on the output data frame.

16. The protection method according to claim 10, wherein the step of performing a check operation on an output data frame corresponding to the input data frame according to the preset check mode to obtain a second operation result includes:

generating and transmitting an output frame end signal and a comparison enable signal when it is determined, based on an output control signal, that a whole of the output data frame has been acquired;

performing, based on the output control signal, sampling and packaging on valid signals of the output data signals, and transmitting a second sampling and packaging result; and generating, based on the second sampling and packaging result, the second operation result that is obtained through performing the check operation on the output data frame.

17. The protection method according to claim 16, wherein the step of generating a first error alarm signal for the data path based on the first operation result and the second operation result includes:

comparing the first operation result with the second operation result in response to the comparison enable signal, and generating the first error alarm signal when a comparison result is that the first operation result and the second operation result do not match with each other.

18. The computer readable storage medium according to claim 11, wherein the protection method further includes steps of:

generating a second error alarm signal for the data path when the number of the same operation results among N first operation results corresponding to N consecutive input data frames and N satisfy a preset relation, where N is an integer greater than or equal to 2; and/or generating a third error alarm signal for the data path when a volume of valid data carried in an input control signal is different from a preset data volume, and/or a duration for frame transmission carried in the input control signal is greater than a preset duration.

19. The computer readable storage medium according to claim 18, wherein the step of performing a check operation on an input data frame according to a preset check mode to obtain a first operation result includes:

generating and transmitting an input frame end signal when it is determined, based on an input control signal, that a whole of the input data frame has been acquired; and performing, based on the input control signal, sampling and packaging on valid signals of the input data signals, and transmitting a first sampling and packaging result; and generating, based on the first sampling and packaging result, the first operation result that is obtained through performing the check operation on the input data frame.

20. The computer readable storage medium according to claim 19, wherein the step of performing a check operation on an output data frame corresponding to the input data frame according to the preset check mode to obtain a second operation result includes:

generate and transmit an output frame end signal and a comparison enable signal when it is determined, based on an output control signal, that a whole of the output data frame has been acquired;

performing, based on the output control signal, sampling and packaging on valid signals of the output data signals, and transmitting a second sampling and packaging result; and generating, based on the second sampling and packaging result, the second operation result that is obtained through performing the check operation on the output data frame.

* * * * *